(12) United States Patent
Kim et al.

(10) Patent No.: US 11,069,666 B2
(45) Date of Patent: Jul. 20, 2021

(54) SEMICONDUCTOR PACKAGE

(71) Applicant: SAMSUNG ELECTRO-MECHANICS CO., LTD., Suwon-si (KR)

(72) Inventors: Chui Kyu Kim, Suwon-si (KR); Dae Hyun Park, Suwon-si (KR); Jung Ho Shim, Suwon-si (KR); Jae Hyun Lim, Suwon-si (KR); Mi Ja Han, Suwon-si (KR); Sang Jong Lee, Suwon-si (KR); Han Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/454,907

(22) Filed: Jun. 27, 2019

(65) Prior Publication Data
US 2020/0168591 A1 May 28, 2020

(30) Foreign Application Priority Data
Nov. 26, 2018 (KR) .................. 10-2018-0147321

(51) Int. Cl.
*H01L 25/16* (2006.01)
*H01L 23/00* (2006.01)
(Continued)

(52) U.S. Cl.
CPC .......... *H01L 25/16* (2013.01); *H01L 23/3128* (2013.01); *H01L 23/3171* (2013.01);
(Continued)

(58) Field of Classification Search
CPC . H01L 25/16; H01L 23/3128; H01L 23/3171; H01L 23/5226; H01L 23/5283;
(Continued)

(56) References Cited

U.S. PATENT DOCUMENTS

2006/0220259 A1* 10/2006 Chen ................. H01L 23/49575
257/778
2009/0309212 A1* 12/2009 Shim ................... H01L 23/3107
257/700

(Continued)

FOREIGN PATENT DOCUMENTS

KR         10-1069488 B1      9/2011
KR      10-2017-0106479 A     9/2017
WO         2016/140819 A2     9/2016

*Primary Examiner* — Feifei Yeung Lopez
(74) *Attorney, Agent, or Firm* — Morgan, Lewis & Bockius LLP

(57) ABSTRACT

A semiconductor package includes a frame having a through-hole, and a first semiconductor chip disposed in the through-hole of the frame and having an active surface on which a connection pad is disposed, an inactive surface opposing the active surface, and a side surface connecting the active and inactive surfaces. A first encapsulant covers at least a portion of each of the inactive surface and the side surface of the first semiconductor chip. A connection structure has a first surface having disposed thereon the active surface of the first semiconductor chip, and includes a redistribution layer electrically connected to the connection pad of the first semiconductor chip. A first passive component is disposed on a second surface of the connection structure opposing the first surface, the first passive component being electrically connected to the redistribution layer and having a thickness greater than a thickness of the first semiconductor chip.

17 Claims, 15 Drawing Sheets

(51) Int. Cl.
  *H01L 23/31* (2006.01)
  *H01L 23/522* (2006.01)
  *H01L 23/528* (2006.01)

(52) U.S. Cl.
  CPC ...... *H01L 23/5226* (2013.01); *H01L 23/5283* (2013.01); *H01L 24/09* (2013.01); *H01L 24/17* (2013.01); *H01L 2224/02373* (2013.01); *H01L 2224/02377* (2013.01); *H01L 2224/02379* (2013.01); *H01L 2224/02381* (2013.01); *H01L 2224/0401* (2013.01); *H01L 2924/1205* (2013.01); *H01L 2924/1206* (2013.01)

(58) Field of Classification Search
  CPC ..................... H01L 24/09; H01L 24/17; H01L 2224/02373; H01L 2224/02377; H01L 2224/02379; H01L 2224/02381; H01L 2224/0401; H01L 2924/1205; H01L 2924/1206
  See application file for complete search history.

(56) References Cited

U.S. PATENT DOCUMENTS

| | | | |
|---|---|---|---|
| 2010/0301474 A1* | 12/2010 | Yang | H01L 24/29 257/737 |
| 2012/0286419 A1 | 11/2012 | Kwon et al. | |
| 2016/0118333 A1* | 4/2016 | Lin | H01L 24/96 257/773 |
| 2016/0276307 A1* | 9/2016 | Lin | H01L 23/552 |
| 2017/0154838 A1* | 6/2017 | Kim | H01L 21/486 |
| 2017/0287825 A1* | 10/2017 | Lee | H01L 24/20 |
| 2017/0287853 A1* | 10/2017 | Kim | H01L 23/49822 |
| 2018/0151502 A1* | 5/2018 | Lin | H01L 24/17 |
| 2018/0158768 A1* | 6/2018 | Kim | H01L 23/49838 |
| 2018/0269181 A1* | 9/2018 | Yang | H01L 23/3121 |
| 2019/0074267 A1* | 3/2019 | Yang | H01L 25/105 |
| 2019/0088621 A1* | 3/2019 | Yang | H01L 25/0652 |

* cited by examiner

I-I'

SEMICONDUCTOR PACKAGE

CROSS-REFERENCE TO RELATED APPLICATION(S)

This application claims benefit of priority to Korean Patent Application No. 10-2018-0147321 filed on Nov. 26, 2018 in the Korean Intellectual Property Office, the disclosure of which is incorporated herein by reference in its entirety.

BACKGROUND

1. Field

The present disclosure relates to a semiconductor package, for example, to a fan-out semiconductor package.

2. Description of Related Art

Semiconductor packaging technology development is continuously pursuing light, thin, short, and small shapes in terms of design, and pursuing a System in Package (SiP) package which requires complexity and versatility in terms of functionality. To this end, there is growing interest in a technique for mounting a plurality of chips and components in a single package.

In detail, in a semiconductor package including an IC chip and a passive component, since the IC chip and the passive component are mounted side by side, there may be a problem in which a size of a package is increased. Further, in the case of an RF module, the passive component is sealed when debugging for the tuning of characteristics, so that there may be a problem in which replacement of the passive component is difficult.

SUMMARY

An aspect of the present disclosure is to provide a semiconductor package having a significantly reduced size and improved reliability.

According to an aspect of the present disclosure, in a semiconductor package, a semiconductor chip and a passive component are mounted on opposite sides of a connection structure.

The semiconductor package includes a frame having a through-hole, and a first semiconductor chip disposed in the through-hole of the frame and having an active surface on which a connection pad is disposed, an inactive surface opposing the active surface, and a side surface connecting the active and inactive surfaces. A first encapsulant covers at least a portion of each of the inactive surface and the side surface of the first semiconductor chip, and a connection structure has a first surface having disposed thereon the active surface of the first semiconductor chip, and includes a redistribution layer electrically connected to the connection pad of the first semiconductor chip. A first passive component is disposed on a second surface of the connection structure opposing the first surface, the first passive component being electrically connected to the redistribution layer and having a thickness greater than a thickness of the first semiconductor chip.

According to another aspect of the disclosure, a semiconductor package includes a frame having a through-hole, a first electronic component disposed in the through-hole of the frame, a first encapsulant covering at least a portion of the first electronic component, and a connection structure having a first surface having disposed thereon the first electronic component and including a redistribution layer electrically connected to the first electronic component. A second electronic component is disposed on a second surface of the connection structure opposing the first surface, and the second electronic component is electrically connected to the redistribution layer and has a thickness different from a thickness of the first electronic component.

According to a further aspect of the disclosure, a semiconductor package includes a connection structure having opposing first and second surfaces, and including pluralities of insulating layers, redistribution layers, and vias for providing electrical interconnections between the redistribution layers. A frame is disposed on the first surface of the connection structure, and has a frame insulating layer with a through-hole. A semiconductor chip is disposed on the first surface of the connection structure and in the through-hole of the frame to be spaced apart from the frame insulating layer, and has an active surface, on which is disposed a connection pad, facing the first surface of the connection structure. At least one electronic component is disposed on the second surface of the connection structure to overlap with the semiconductor chip along a stacking direction of the semiconductor chip on the connection structure. An encapsulant is disposed in the through-hole between the frame insulating layer and the semiconductor chip, and extends to a first surface of the frame opposing a second surface of the frame facing the connection structure.

Other features and aspects will be apparent from the following detailed description, the drawings, and the claims.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
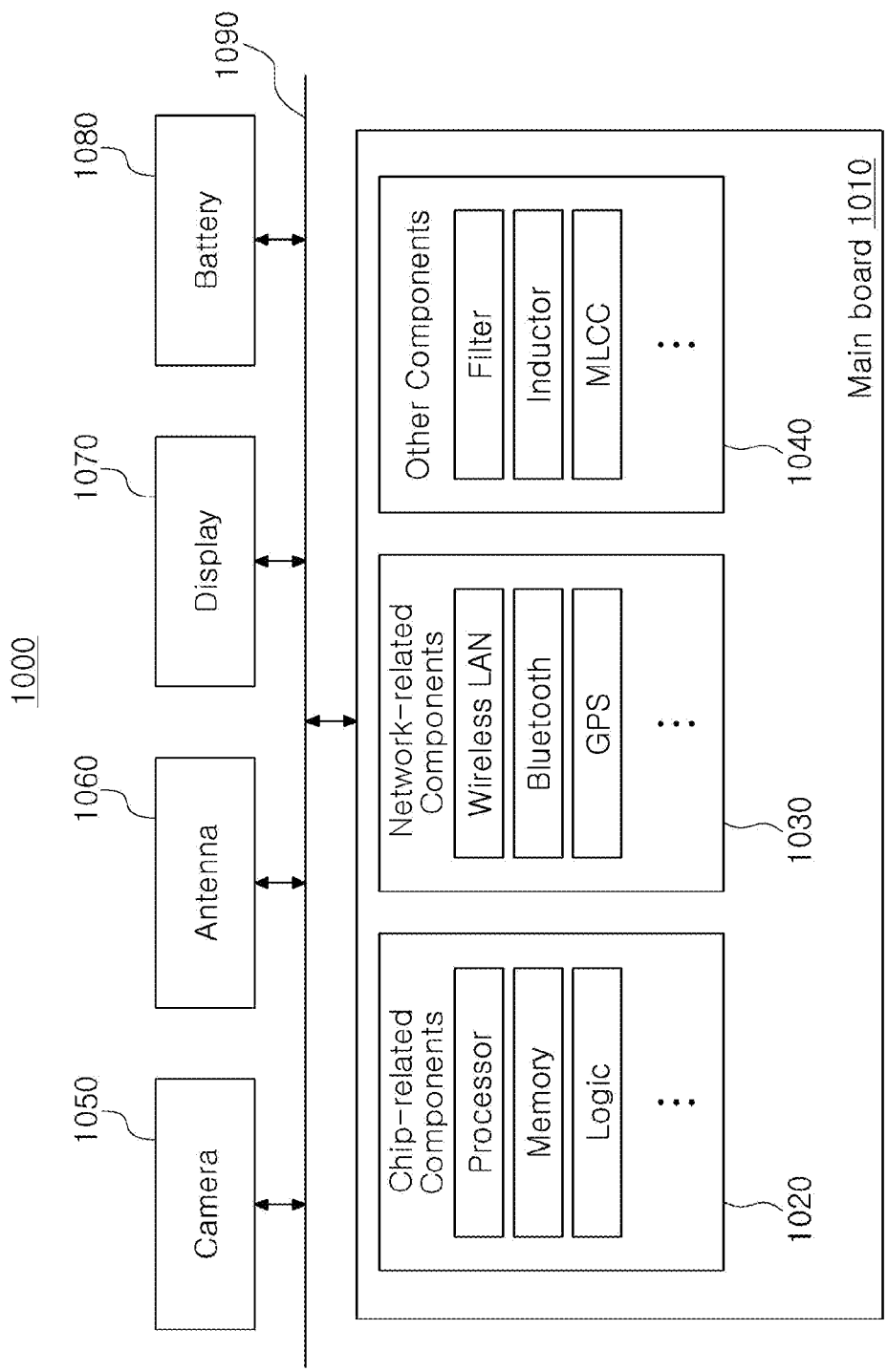
FIG. 1 is a schematic block diagram illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only illustrative configurations herein, but are not limited thereto.

Electronic Device

FIG. 1 is a schematic block diagram illustrating an example of an electronic device system.

Referring to FIG. 1, an electronic device 1000 may accommodate a mainboard 1010 therein. The mother board 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term. evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
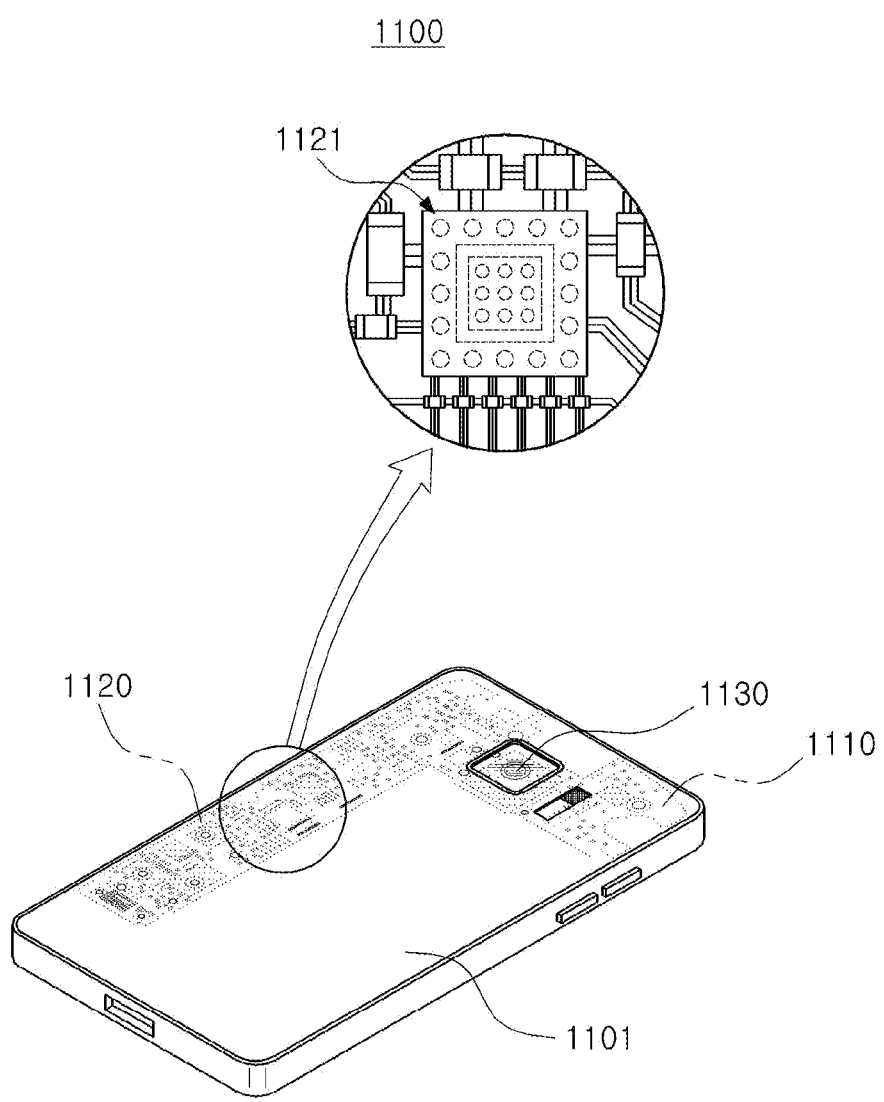
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is advantageously used due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology can be used for buffering a difference in a circuit width between the semiconductor chip and the mainboard.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
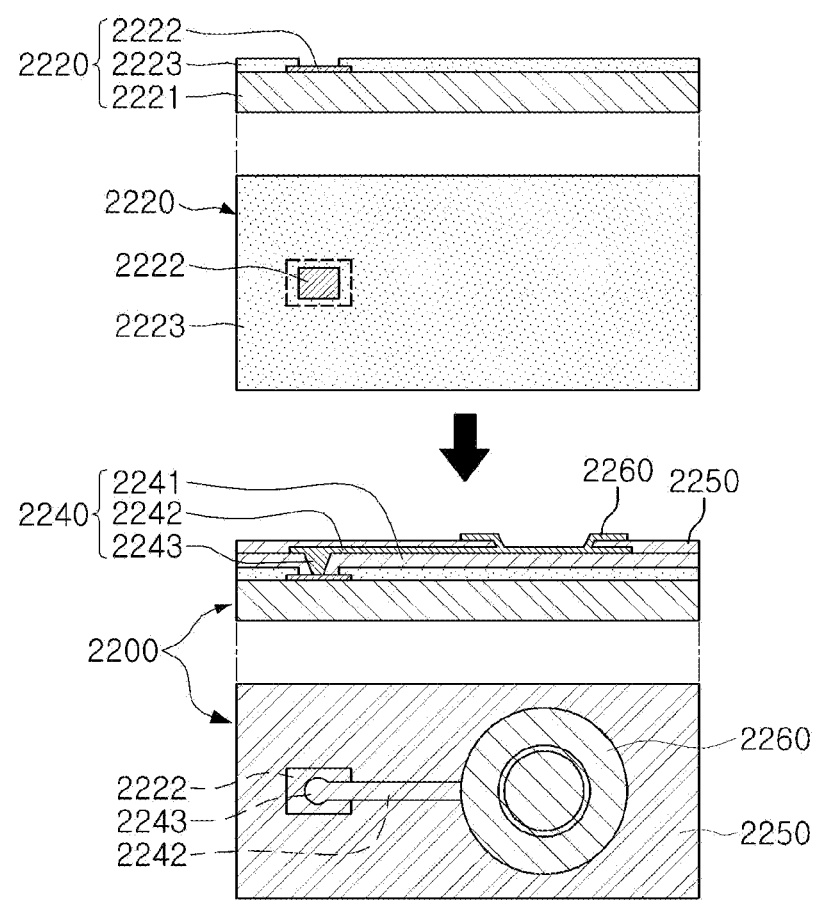
FIGS. 3A and 3B are schematic cross-sectional views illustrating a fan-in semiconductor package before and after being packaged.
Figure 3B:
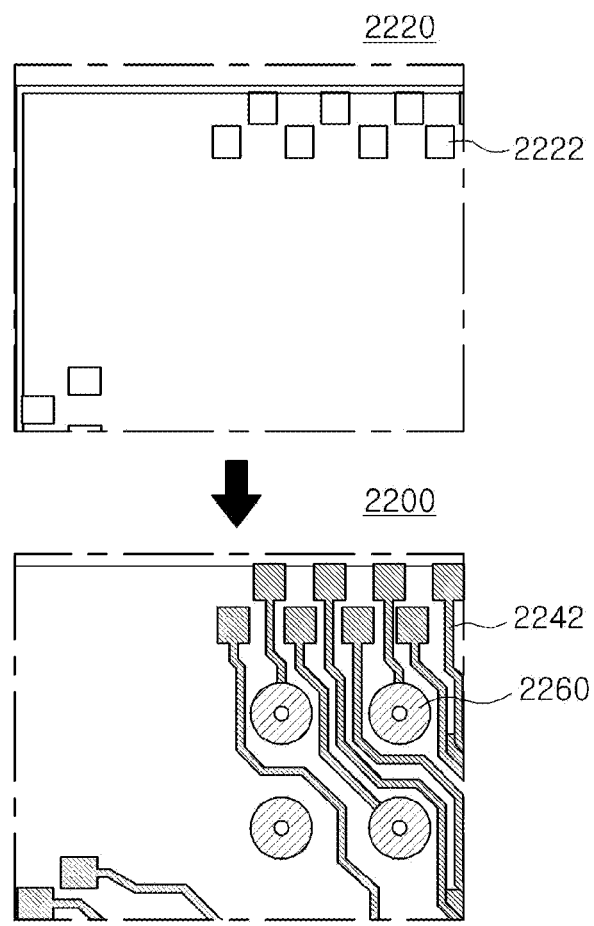

FIGS. 3A and 3B are schematic cross-sectional views illustrating states of a fan-in semiconductor package before and after being packaged.

Figure 4:
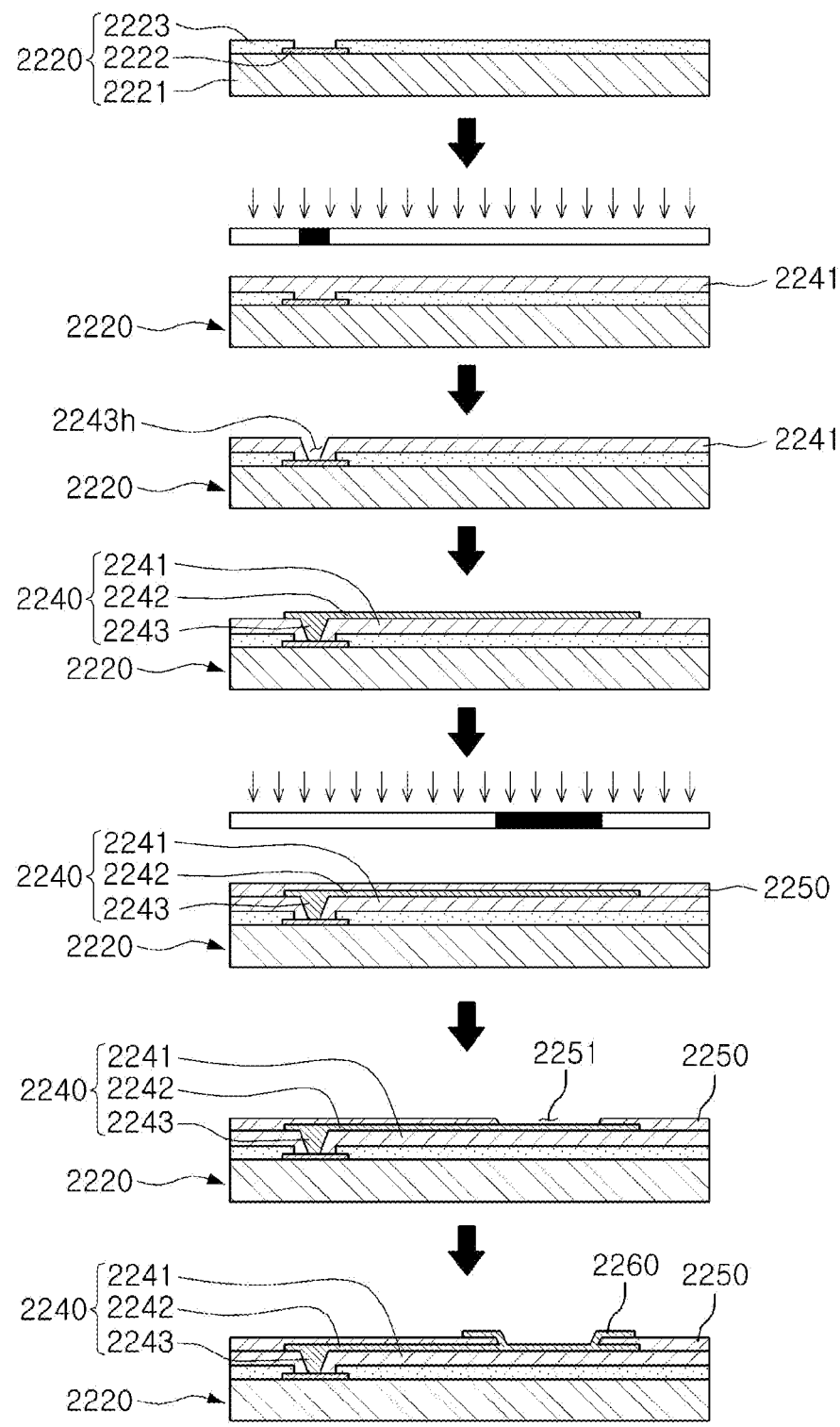
FIG. 4 is a schematic cross-sectional view illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photo imageable dielectric (PID) resin, forming via holes 2243*h* opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. Here, even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
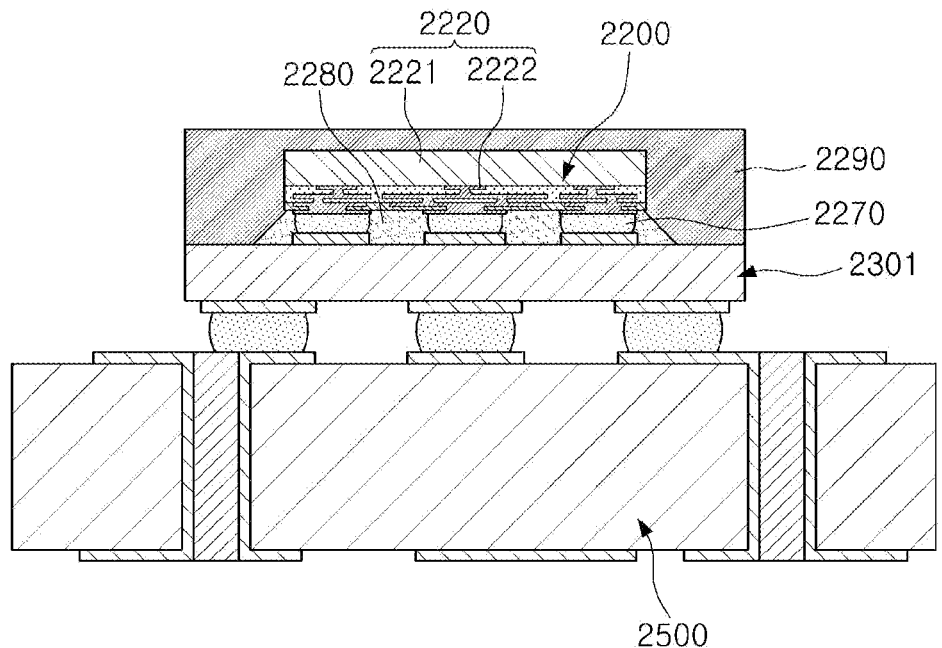
FIG. 5 is a schematic cross-sectional view illustrating a fan-in semiconductor package mounted on an interposer substrate and ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
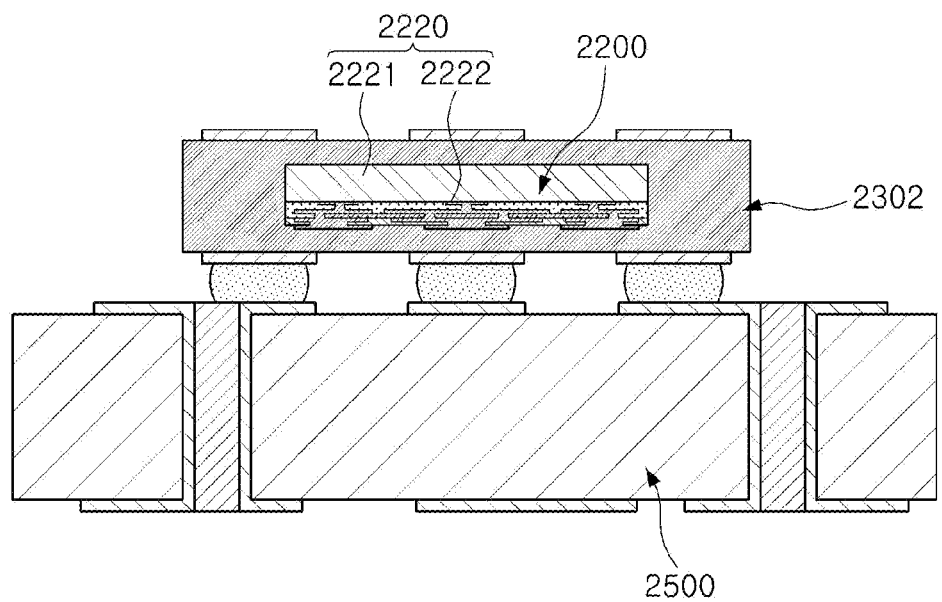
FIG. 6 is a schematic cross-sectional view illustrating a fan-in semiconductor package embedded in an interposer substrate and ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
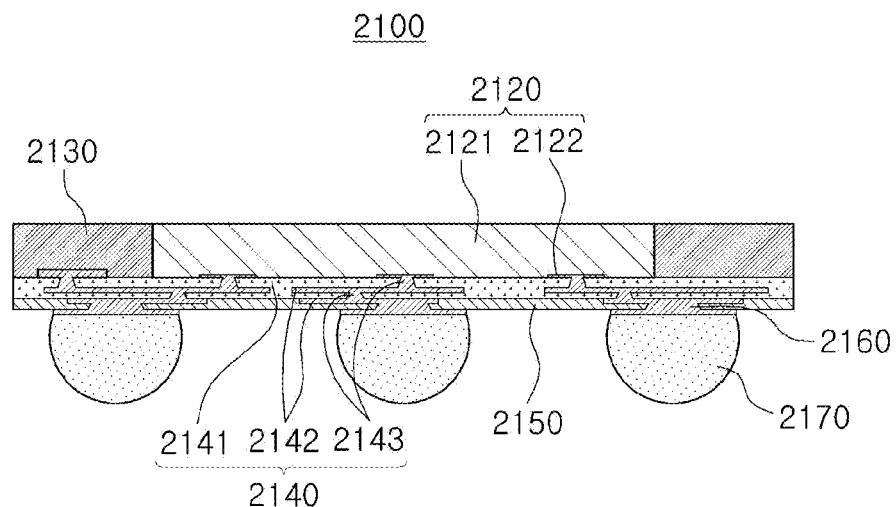
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2202 may further be formed on the connection structure 2140, and an underbump metal layer 2160 may further be formed in openings of the passivation layer 2202. Solder balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
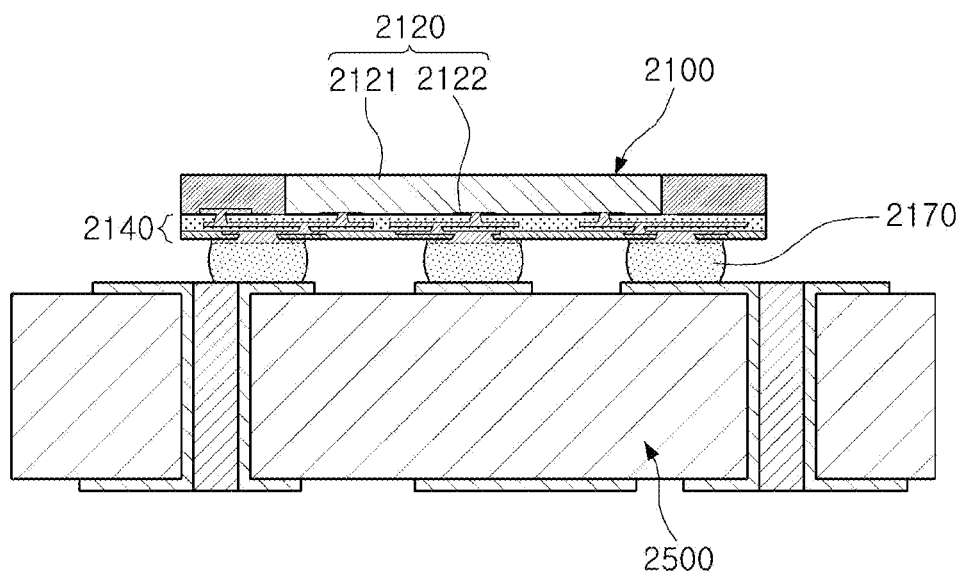
FIG. 8 is a schematic cross-sectional view illustrating a fan-out semiconductor package mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
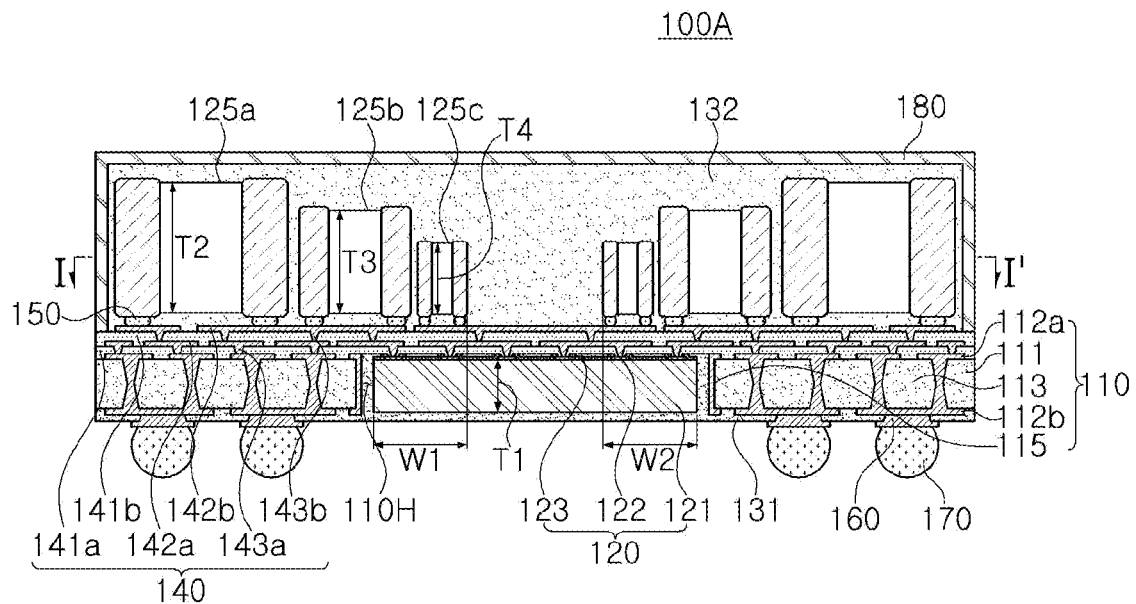
FIG. 9 is a schematic cross-sectional view illustrating an example of a semiconductor package in accordance with the principles of the disclosure.

FIG. 9 is a schematic cross-sectional view illustrating an example of a semiconductor package.

Figure 10:
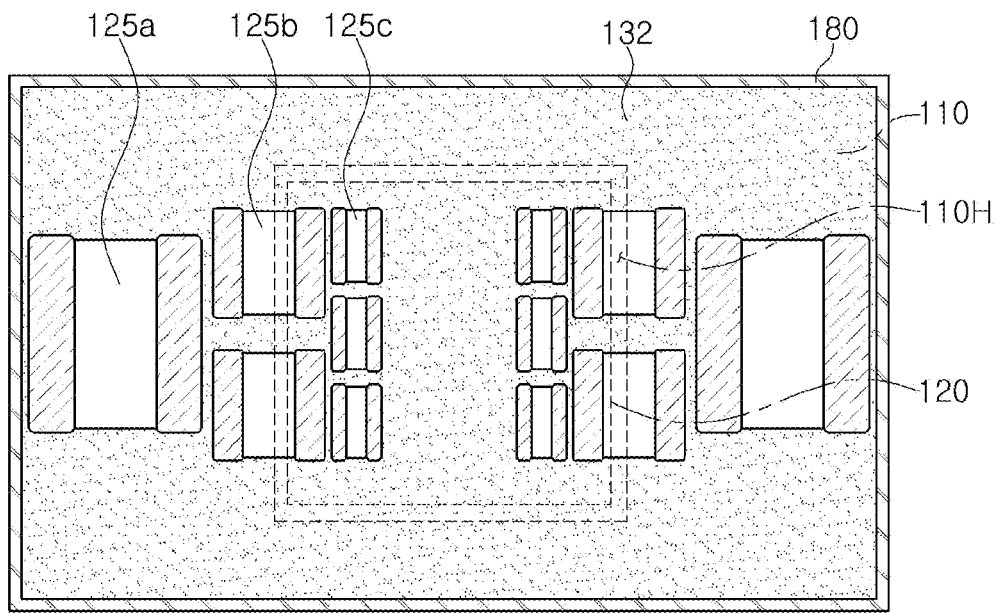
FIG. 10 is a schematic plan view taken along line I-I' of the semiconductor package of FIG. 9.

FIG. 10 is a schematic plan view taken along line I-I' of the semiconductor package of FIG. 9.

Referring to FIGS. 9 and 10, a semiconductor package 100A according to an embodiment may include a frame 110 having a through-hole 110H, a semiconductor chip 120 disposed in the through-hole 110H of the frame 110 and having an active surface on which a connection pad 122 is disposed and an inactive surface opposing the active surface, a first encapsulant 131 sealing at least portions of the frame 110 and the semiconductor chip 120, a connection structure 140 disposed on an upper surface of the frame 110 and the active surface of the semiconductor chip 120 and including at least one redistribution layer 142a and/or 142b, at least one passive component 125a, 125b, and/or 125c, mounted on an upper surface of the connection structure 140, a second encapsulant 132 sealing the passive components 125a, 125b, and 125c, a metal layer 180 covering an upper surface and a side surface of the second encapsulant 132, an underbump metal layer 160 disposed on a lower surface of the frame 110, and an electrical connection metal 170 connected to the underbump metal layer 160.

The connection structure 140 may be electrically connected to the semiconductor chip 120 and the passive components 125a, 125b, and 125c, disposed on opposing sides of the connection structure 140, and may redistribute the connection pad 122 of the semiconductor chip 120. On the semiconductor chip 120 and the frame 110, the insulating layers 141a and 141b, the redistribution layers 142a and 142b, and vias 143a and 143b are formed one layer by one layer, and thus the connection structure 140 may be disposed as described above. Moreover, in the connection structure 140, the passive components 125a, 125b, and 125c may be mounted on a second surface of the connection structure 140 opposing a first surface of the connection structure 140 (where the first surface may be a surface on which the semiconductor chip 120 is disposed). The passive components 125a, 125b, and 125c may be mounted on the connection structure 140, using the surface mount technology (SMT) by way of example, but is not limited thereto.

As described above, in the packages according to the related art, a semiconductor chip and an electronic component such as a passive component are arranged side by side. In this case, a space is used to place each component, so there may be a problem in which a size of a package, particularly, an area on the plane along which the semiconductor chip(s) and electronic component(s) are disposed is increased. Moreover, when a passive component is sealed by an encapsulant together with a semiconductor chip, it may be difficult to perform tuning of characteristics since it is difficult to replace a passive component during debugging.

On the other hand, in a semiconductor package 100A according to an embodiment, a plurality of electronic components are divided and arranged above and below the connection structure 140. In detail, the passive components 125a, 125b, and 125c are mounted on one side of the connection structure 140 opposing another side connected to the semiconductor chip 120, and at least a portion of the passive components 125a, 125b, and 125c is disposed to overlap the semiconductor chip 120 on the plane (e.g., at least a portion of the passive components 125a, 125b, and 125c may overlap the semiconductor chip 120 along the stacking direction of the components on the connection structure 140). Thus, a size of the semiconductor package 100A may be reduced by widths W1 and W2, in which the semiconductor chip 120 and the passive components 125a, 125b, and 125c are overlapped. The passive components 125a, 125b, and 125c may include first to third passive components 125a, 125b, and 125c having different thicknesses. The first passive component 125a is disposed to overlap the frame 110 on the plane, the second passive component 125b is disposed to overlap the frame 110 and the semiconductor chip 120 on the plane, and the third passive component 125c is disposed to overlap the semiconductor chip 120 on the plane. In other words, at least a portion of the first passive component 125a is disposed in a region immediately above the frame 110 (e.g., and spaced apart from the semiconductor chip 120 along the stacking direction), at least a portion of the second passive component 125b is disposed in regions immediately above the frame 110 and the semiconductor chip 120, and at least a portion of the third passive component 125c is disposed in a region immediately above the semiconductor chip 120 (e.g., and spaced apart from the frame 110 along the stacking direction). The first to third passive components 125a, 125b, and 125c may have different thicknesses T2, T3, and T4, and at least one, among the first to third passive components, may have a thickness greater than a thickness T1 of the semiconductor chip 120, and may have a thickness greater than a thickness of the frame 110. According to embodiments, the first to third passive components 125a, 125b, and 125c may have thicknesses T2, T3, and T4, each greater than the thickness T1 of the semiconductor chip 120. In this case, a thickness of the frame 110 may be significantly reduced in accordance with the thickness T1 of the semiconductor chip 120, and thus a thickness of the semiconductor package 100A may also be optimized.

Moreover, in the semiconductor package 100A, after the semiconductor chip 120 is sealed by the first encapsulant 131, the passive components 125a, 125b, and 125c are mounted, and testing or debugging for the passive components 125a, 125b, and 125c may be performed. Accordingly, when it is determined that the passive components 125a, 125b, and 125c are not suitable, the corresponding passive components 125a, 125b, and 125c may be easily replaced. Moreover, after the passive components 125a, 125b, and 125c are replaced, a second encapsulant 132 and a metal layer 180 may be formed. Thus, a degree of freedom in component debugging of the semiconductor package 100A is improved, so the manufacturing costs may be reduced.

The respective components included in the semiconductor package 100A according to the exemplary embodiment will hereinafter be described in more detail.

The frame 110 may improve rigidity of the semiconductor package 100A depending on certain materials, and serve to secure uniformity of a thickness of the first encapsulant 131. The frame 110 may have at least one through-hole 110H. The through-hole 110H may pass through the frame 110, while the semiconductor chip 120 may be disposed in the through-hole 110H. As illustrated in FIG. 10, the semiconductor chip 120 may be disposed to be spaced apart from a wall surface of the through-hole 110H by a predetermined distance, and may be surrounded by the wall surface of the through-hole 110H. However, such a form is only an example and may be variously modified to have other forms, and another function may be performed depending on such a form. The frame 110 may be omitted, optionally, but the case having the frame 110 may be more advantageous in securing the board level reliability as intended in the present disclosure.

The frame 110 may include a frame insulating layer 111, a first wiring layer 112a and a second wiring layer 112b, on opposing sides/surfaces of the frame insulating layer 111, a connection via 113 passing through the frame insulating layer 111, and a frame metal layer 115 on an inner side wall of the through-hole 110H. An insulating material may be used as the material of the frame insulating layer 111. In this case, the insulating material may be a thermosetting resin such as an epoxy resin, a thermoplastic resin such as a polyimide resin, an insulating material in which the thermosetting resin or the thermoplastic resin is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Such a frame 110 may serve as a supporting member.

The first wiring layer 112a and the second wiring layer 112b may serve to redistribute the connection pad 122 of the semiconductor chip 120, and may serve to provide a pad pattern for the connection via 113 for connection of an upper portion and a lower portion of the package 100A. A formation material of each of the first and second wiring layers 112a and 112b may be a metallic material such as copper (Cu), aluminum (Al), silver (Ag), tin (Sn), gold (Au), nickel (Ni), lead (Pb), titanium (Ti), or alloys thereof. The first and second wiring layers 112a and 112b perform various functions depending on designs of layers thereof. For example, the first and second wiring layers may include ground (GND) patterns, power (PWR) patterns, signal (S) patterns, and the like. Here, the signal (S) patterns may include various signals except for the ground (GND) patterns, the power (PWR) patterns, and the like, such as data signals, and the like.

The connection via 113 may electrically connect the first and second wiring layers 112a and 112b, formed on different layers, to each other, resulting in an electrical path in the frame 110. Moreover, the connection via 113 may form an electrical path between the connection structure 140 and the electrical connection metal 170. A formation material of the connection via 113 may be a metallic material. Each of the connection vias 113 may be a filled via, completely filled with a metallic material, or may be a conformal via, in which a metallic material is formed along a wall surface of a via hole. Moreover, each of the connection vias may have a tapered shape. On the other hand, the connection via 113 may be integrated with at least a portion of the first and second wiring layers 112a and 112b, but is not limited thereto.

The frame metal layer 115 may be disposed on an upper surface and a lower surface of the frame insulating layer 111 and an inner side wall of the through-hole 110H. The frame metal layer 115 may be disposed to surround the semiconductor chip 120. The frame metal layer 115 may be introduced to improve an electromagnetic interference (EMI) shielding effect and a heat dissipation effect of the semiconductor chip 120. The frame metal layer 115 may include a conductive material such as copper (Cu), aluminum (Al), silver (Ag), tin (Sn), gold (Au), nickel (Ni), lead (Pb), titanium (Ti), or alloys thereof. The frame metal layer 115 may be formed using a plating process, and may be formed of a seed layer and a conductor layer. The frame metal layer 115 may be used as a ground. In this case, the frame metal layer may be electrically connected to a ground pattern in the connection structure 140.

The semiconductor chip 120 may be an integrated circuit (IC) providing in an amount of several hundred to several million or more elements integrated in a single chip. The IC may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, and the semiconductor chip may be a logic chip such as an analog-to-digital converter (ADC), an application-specific integrated circuit (ASIC), or the like, or a memory chip such as a volatile memory (for example, a dynamic random access memory (DRAM)), a non-volatile memory (for example, a read only memory (ROM)), a flash memory, or the like, but is not limited thereto. Moreover, these chip related components and/or functions may be also combined in a same semiconductor chip 120.

In the semiconductor chip 120, a side or surface on which connection pad 122 is disposed is referred to as an active surface, and the opposite side or surface is referred to as an inactive surface. The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide layer, a nitride layer, or the like, or a double layer of an oxide layer and a nitride layer.

The first encapsulant 131 may fill at least a portion of the through-hole 110H, while sealing the semiconductor chip 120. An encapsulation form of the first encapsulant 131 is not particularly limited, but may be a form in which the first encapsulant 131 surrounds at least a portion of the semiconductor chip 120. In this case, the first encapsulant 131 may cover at least portions of the frame 110 and an inactive surface of the semiconductor chip 120, and fill at least a portion of a space between a wall surface of the through-hole 110H and a side surface of the semiconductor chip 120. Meanwhile, the first encapsulant 131 may fill the through-hole 110H to thus serve as an adhesive for fixing the semiconductor chip 120 and reduce buckling depending on certain materials. The first encapsulant 131 may include an insulating material. The insulating material may be a material containing an inorganic filler and an insulating resin, for example, a thermosetting resin such as an epoxy resin, a thermoplastic resin such as a polyimid, or a resin in which a reinforcement such as an inorganic filler is contained in the thermosetting resin or the thermoplastic resin, in detail, an Ajinomoto build-up film (ABF), an FR-4 resin, a bismaleimide triazine (BT) resin, a resin, or the like. Moreover, an epoxy molding compound (EMC), a photo imageable encapsulant (PIE), or the like, may be used therefor. As needed, a material in which an insulating resin such as the thermosetting resin or the thermoplastic resin is impregnated in a core material such as an inorganic filler and/or a glass fiber (or a glass cloth or a glass fabric), may be used.

Several tens to several hundreds of connection pads 122 of the semiconductor chip 120 having various functions may be redistributed by the connection structure 140, and may be physically or electrically externally connected to the passive components 125a, 125b, and 125c in an upper portion. The connection structure 140 may include a first insulating layer 141a disposed on the frame 110 and the active surface of the semiconductor chip 120, a first redistribution layer 142a disposed on the first insulating layer 141a, a first via 143a connecting the first redistribution layer 142a to the frame metal layer 115, or connecting the first redistribution layer 142a to the connection pad 122 of the semiconductor chip 120 or to the first wiring layer 112a, a second insulating layer 141b disposed on the first insulating layer 141a, a second redistribution layer 142b disposed on the second insulating layer 141b, and a second via 143b connecting the first and second redistribution layers 142a and 142b while passing through the second insulating layer 141b. The connection structure 140 may include a number of insulating layers, redistribution layers, and vias, greater than illustrated in the drawings.

A material of each of the insulating layers 141a and 141b may be an insulating material. In this case, a photosensitive insulating material such as a PID resin may also be used as the insulating material. That is, each of the insulating layers 141a and 141b may be a photosensitive insulating layer. When the insulating layers 141a and 141b have photosensitive properties, the insulating layers 141a and 141b may be formed to have a smaller thickness, and fine pitches of the vias 143a and 143b may be achieved more easily. Each of the insulating layers 141a and 141b may be a photosensitive insulating layer including an insulating resin and an inorganic filler. When the insulating layers 141a and 141b are multiple layers, materials of the insulating layers 141a and 141b may be the same as each other, and may alternatively be different from each other. When the insulating layers 141a and 141b are multiple layers, the insulating layers 141a and 141b may be integrated with each other depending on processes, so that a boundary therebetween may not be readily apparent. The number of insulating layers, greater than those illustrated in the drawings, may be provided. According to embodiments, a passivation layer, exposing at least a portion of the second redistribution layer 142b, may be further disposed on the second insulating layer 141b in an uppermost portion.

The redistribution layers 142a and 142b may substantially serve to redistribute the connection pads 122, and a formation material thereof may be a conductive material such as copper (Cu), aluminum (Al), silver (Ag), tin (Sn), gold (Au), nickel (Ni), lead (Pb), titanium (Ti), or alloys thereof. The redistribution layers 142a and 142b may perform various functions depending on designs of corresponding layers. For example, the redistribution layers may include ground (GND) pattern layers 142G, and may include power (PWR) patterns, signal (S) patterns, and the like. Here, the signal (S) patterns may include various signals except for the ground (GND) signals, the power (PWR) signals, and the like, such as data signals, and the like. Moreover, the redistribution layers 142a and 142b may include via pad patterns.

The vias 143a and 143b may electrically connect the redistribution layers 142a and 142b, the connection pads 122, the first wiring layer 112a, and the like, formed on different layers, to each other, resulting in an electrical path in the semiconductor package 100A. A material of each of the vias 143a and 143b may be a conductive material such as copper (Cu), aluminum (Al), silver (Ag), tin (Sn), gold (Au), nickel (Ni), lead (Pb), titanium (Ti), or alloys thereof. Each of the vias 143a and 143b may be completely filled with a conductive material, or the conductive material may be formed along a wall of a via. In addition, the via 143 may have various shapes such as a tapered shape, a cylindrical shape, and the like.

The passive components 125a, 125b, and 125c may be electrically connected to the second redistribution layer 142b of the connection structure 140 through the bump 150. Each of the passive components 125a, 125b, and 125c may be a capacitor such as a multilayer ceramic capacitor (MLCC) or a low inductance chip capacitor (LICC), an inductor such as a power inductor, a bead, or the like, independently. The passive components 125a, 125b, and 125c may have different sizes and thicknesses. Moreover, each of the passive components 125a, 125b, and 125c may have a thickness different from a thickness of the semiconductor chip 120. In the semiconductor package 100A according to an embodiment, the passive components 125a, 125b, and 125c and the semiconductor chip 120 are sealed in different processes, so a problem of defects due to such thickness variations may be significantly reduced. The number of the passive components 125a, 125b, and 125c are not particularly limited, and may be more or less than that illustrated in the drawings.

Each of the bumps 150 may be formed of a conductive material, for example, copper (Cu), a solder, or the like. However, this is only an example, and a material of each of the bumps 150 is not particularly limited thereto. Each of the bumps 150 may be a land, a ball, a pin, or the like.

The second encapsulant 132 may seal at least a portion of upper surfaces of one or more passive components 125a, 125b, and 125c as well as the connection structure 140. An encapsulation form of the second encapsulant 132 is not particularly limited, but may be a form in which the second encapsulant 132 surrounds at least portions of the passive components 125a, 125b, and 125c on the connection structure 140. The second encapsulant 132 may cover at least portions of an upper surface, a lower surface, and a side surface of the passive components 125a, 125b, and 125c. The second encapsulant 132 is extended to the connection structure 140 to be disposed on the connection structure 140, and may be in contact with an upper surface of the second redistribution layer 142b. The second encapsulant 132 and the first encapsulant 131 may include the same or different materials.

The metal layer 180 covers an upper surface and a side surface of the second encapsulant 132, and may be extended to the second surface of the connection structure 140, e.g. an upper surface of the connection structure 140 having the passive components 125a, 125b, and 125c thereon. The metal layer 180 may be connected to the redistribution layers 142a and 142b in a region not illustrated, and thus a ground signal may be applied from the connection structure 140. However, an embodiment is not limited thereto. Due to the metal layer 180, an EMI shielding function of the semiconductor package 100A may be further improved. The metal layer 180 may include a metallic material such as copper (Cu), aluminum (Al), silver (Ag), tin (Sn), gold (Au), nickel (Ni), lead (Pb), titanium (Ti), or alloys thereof.

The underbump metal layer 160 may improve connection reliability of the electrical connection metal 170 to improve board level reliability of the semiconductor package 100A. The underbump metal layer 160 may be connected to the second wiring layer 112b through an opening of the first encapsulant 131 on a lower surface of the frame 110. The underbump metal layers 160 may be formed in the openings by a metallization method using a conductive material such as a metal, but are not limited thereto.

The electrical connection metal 170 physically and/or electrically connects the semiconductor package 100A to an external power source. For example, the semiconductor package 100A may be mounted on the mainboard of the electronic device through the electrical connection metal 170. The electrical connection metal 170 may be formed of a conductive material, for example, a solder or the like. However, this is only an example, and a material of each of the electrical connection metal 170 is not particularly limited thereto. Each of the electrical connection metals 170 may be a land, a ball, a pin, or the like. The electrical connection metals 170 may be formed as a multilayer or single layer structure. When the electrical connection metal includes the plurality of layers, the electrical connection metal includes a copper pillar and a solder. When the electrical connection metal includes the single layer, the electrical connection metal includes a tin-silver solder or copper. However, the electrical connection metal is only an example, and the present disclosure is not limited thereto. The number, an interval, a disposition form, and the like, of electrical connection metal 170 are not particularly limited, but may be sufficiently modified depending on design particulars. For example, the electrical connection metals 170 may be provided in an amount of several tens to several thousands, or may be provided in an amount of several tens to several thousands or more or several tens to several thousands or less.

At least one of the electrical connection metals 170 may be disposed in a fan-out region of the semiconductor chip 120. The fan-out region refers to a region except for (or outside of) a region in which the semiconductor chip 120 is disposed (e.g., outside of a region of overlap with the semiconductor chip 120 along a stacking direction of the semiconductor chip 120 on the connection structure 140). The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a small thickness, and may have price competitiveness.

Figure 11:
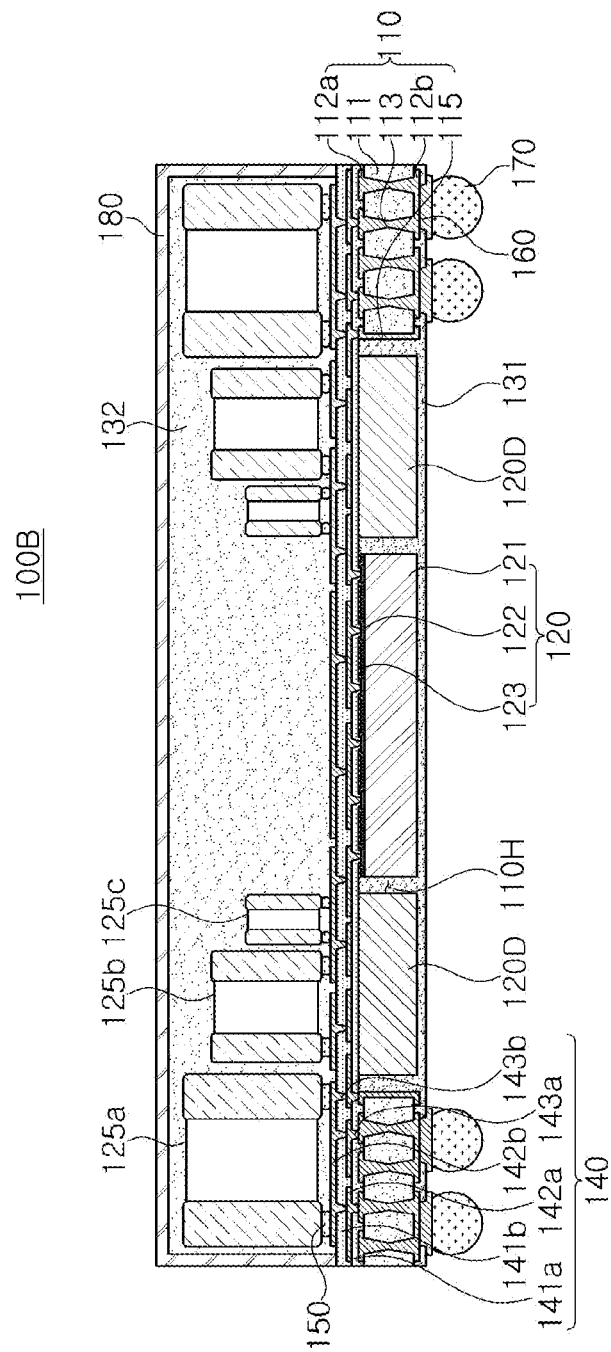
FIG. 11 is a schematic cross-sectional view illustrating another example of a semiconductor package in accordance with the principles of the disclosure.

FIG. 11 is a schematic cross-sectional view illustrating another example of a semiconductor package.

Referring to FIG. 11, a semiconductor package 100B according to another embodiment may further include at least one dummy chip 120D disposed in parallel with the semiconductor chip 120 in the periphery of the semiconductor chip 120. The dummy chip 120D may be disposed in at least one side of the semiconductor chip 120, and may have a size similar to or smaller than that of the semiconductor chip 120. The dummy chip 120D may be formed on the basis of a wafer, and may include silicon (Si), germanium (Ge), gallium arsenide (GaAs), or the like. The dummy chip 120D may not include a circuit formed therein, in a manner different from the semiconductor chip 120. Even when the dummy chip includes a circuit formed therein, an electrical signal may not be applied so as not to function electrically in the semiconductor package 100B. For example, the dummy chip 120D may be in a floating state. As the dummy chip 120D is disposed, rigidity is strengthened in the semiconductor package 100B, so occurrence of defects due to warpage, or the like, may be prevented. Moreover, the dummy chip 120D may also function as a heat dissipation layer, so heat, generated from the semiconductor chip 120, may be easily emitted in a lateral direction. Other configurations are substantially the same as those described in the above-described semiconductor package 100A and the like, and a detailed description thereof will be omitted.

Figure 12:
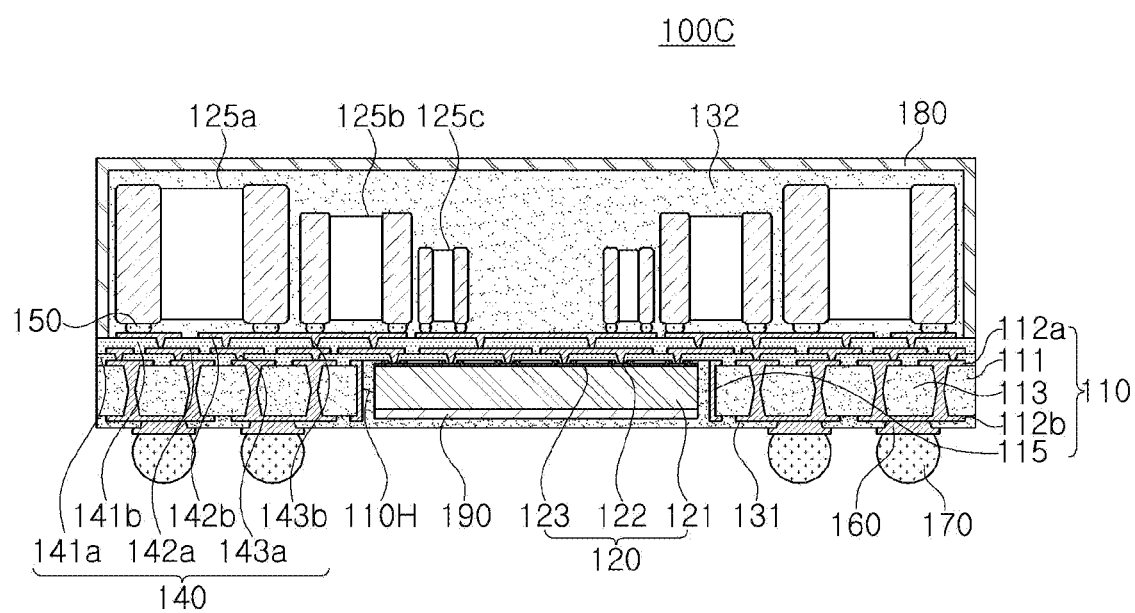
FIG. 12 is a schematic cross-sectional view illustrating another example of a semiconductor package in accordance with the principles of the disclosure.

FIG. 12 is a schematic cross-sectional view illustrating another example of a semiconductor package.

Referring to FIG. 12, a semiconductor package 100C according to another embodiment may further include a heat-dissipating member 190 disposed on a lower surface of the semiconductor chip 120. The heat-dissipating member 190 is disposed on an inactive surface of the semiconductor chip 120 in the through-hole 110H of the frame 110, and thus may be disposed without increasing a size of the semiconductor package 100C. The heat-dissipating member 190 may include a material with excellent thermal conductivity, and may include a conductive material such as copper (Cu), aluminum (Al), silver (Ag), tin (Sn), gold (Au), nickel (Ni), lead (Pb), titanium (Ti), or alloys thereof, by way of example. Other configurations are substantially the same as those described in the above-described semiconductor package 100A and the like, and a detailed description thereof will be omitted.

Figure 13:
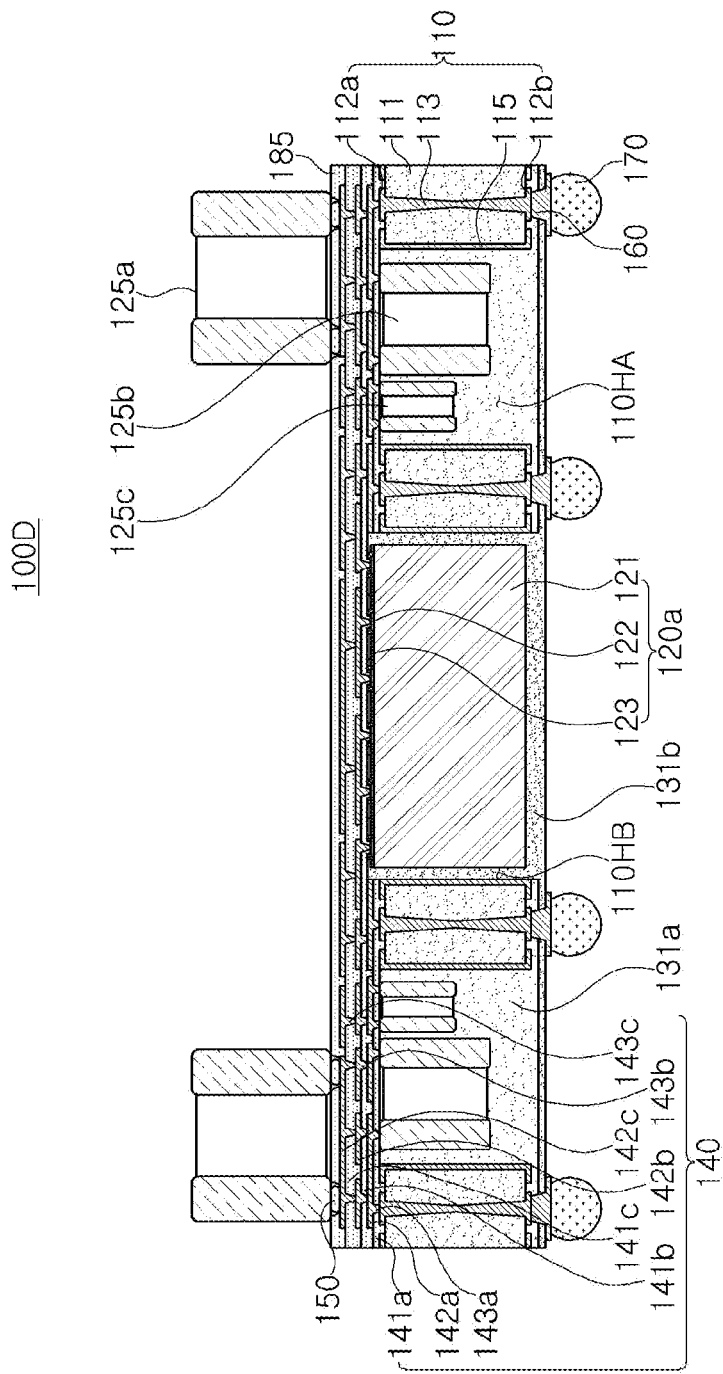
FIG. 13 is a schematic cross-sectional view illustrating another example of a semiconductor package in accordance with the principles of the disclosure.

FIG. 13 is a schematic cross-sectional view illustrating another example of a semiconductor package.

Referring to FIG. 13, a semiconductor package 100D according to another embodiment may include a frame 110 having a first through-hole 110HA and a second through-hole 110HB, at least one passive component 125b and at least one passive component 125c disposed in the first through-hole 110HA of the frame 110, a semiconductor chip 120a disposed in the second through-hole 110HB of the frame 110, and having an active surface on which the connection pad 122 is disposed and an inactive surface opposing the active surface, a first encapsulant 131a sealing at least portions of the frame 110 and the passive components 125b and 125c, a second encapsulant 131b sealing at least portions of the frame 110 and the semiconductor chip 120a, a connection structure 140 disposed on an upper surface of the frame 110 and the active surface of the semiconductor chip 120a, a passivation layer 185 on the connection structure 140, at least one passive component 125a mounted on an upper surface of the connection structure 140, an underbump metal layer 160 disposed on a lower surface of the frame 110, and an electrical connection metal 170 connected to the underbump metal layer 160.

The frame 110 has a plurality of through-holes 110HA and 110HB. The first and second through-holes 110HA and 110HB may be disposed to be physically spaced apart from each other. Some passive components 125b and 125c, among the passive components 125a, 125b, and 125c, may be disposed in the first through-hole 110HA. The second through-hole 110HB may pass through the frame 110 and the first encapsulant 131a, while the semiconductor chip 120a may be disposed in the second through-hole 110HB.

On the other hand, in one example, the passive components 125b and 125c, disposed in parallel with the semiconductor chip 120a (e.g., in a same plane as the semiconductor chip), may form a single component embedded structure. The component embedded structure may include passive components 125b and 125c, a frame 110, a first encapsulant 131, as well as a first insulating layer 141a, a first redistribution layer 142a, and a first via 143a, of the connection structure 140. According to embodiments, the frame 110 may be omitted from the component embedded structure.

The first encapsulant 131a fills at least a portion of the first through-hole 110HA, and may seal one or more passive components 125b and 125c in the first through-hole 110HA. An encapsulation form of the first encapsulant 131a is not particularly limited, but may be a form in which the first encapsulant 131a surrounds at least portions of the passive components 125b and 125c. The first encapsulant 131a may cover at least portions of an upper surface and a lower surface of the passive components 125b and 125c, and may fill at least a portion of a space between wall surfaces of the first through-hole 110HA and side surfaces of a plurality of passive components 125b and 125c. The first encapsulant 131a is extended to a lower surface of the frame 110 to be disposed on the lower surface of the frame 110, and may be in contact with the frame metal layer 115. The first encapsulant 131a and the second encapsulant 131b may include the same or different materials.

The second encapsulant 131b is disposed on the inactive surface of the semiconductor chip 120a, is extended on a lower surface of the first encapsulant 131a to face lower surfaces of the passive components 125b and 125c and the frame 110, and is disposed on the lower surface of the first encapsulant 131a, covering lower surfaces of the passive components 125b and 125c and the frame 110. Thus, the first and second encapsulants 131a and 131b are stacked sequentially and arranged on the lower surfaces of the passive components 125b and 125c and the frame 110, and the second encapsulant 131b may be disposed on the lower surface of the semiconductor chip 120a.

The connection structure 140 may include a first insulating layer 141a disposed on the frame 110 and the passive components 125b and 125c, a first redistribution layer 142a disposed on the first insulating layer 141a, and a first via 143a connecting the first redistribution layer 142a, the passive components 125b and 125c, and the frame metal layer 115. The connection structure 140 may further include the second insulating layer 141b disposed on the first insulating layer 141a, the second redistribution layer 142b disposed on the second insulating layer 141b, and the second via 143b connecting the first and second redistribution layers 142a and 142b or connecting the connection pad 122 of the semiconductor chip 120a and the second redistribution layer 142b while passing through the second insulating layer 141b. The connection structure 140 may also include a third insulating layer 141c disposed on the second insulating layer 141b, a third redistribution layer 142c disposed on the third insulating layer 141c, and a third via 143c connecting the second and third redistribution layers 142b and 142c while passing through the third insulating layer 141c.

The passivation layer 185 may correspond to a protective layer protecting the connection structure 140 from external physical or chemical damage. The passivation layer 185 may have an opening exposing at least a portion of the third redistribution layer 142c. The number of openings, formed in the passivation layer 185, may be several tens to several thousands. For example, an insulating material may be used as the material of the passivation layer 185. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

In the semiconductor package 100D according to an embodiment, a portion among the passive components 125a, 125b, and 125c (e.g., passive components 125b and 125c) are disposed in the first through-hole 110HA of the frame 110, and a remaining portion (e.g., a passive component 125a) may be mounted on the connection structure 140 through the bump (s) 150. That is, the passive components 125a, 125b, and 125c may be divided and disposed above and below the connection structure 140 according to their configurations. Moreover, in the semiconductor package 100D, instead of the passivation layer 185 on the connection structure 140, an encapsulant 132 covering the passive component 125a and a metal layer 180 disposed on the encapsulant 132, as illustrated in FIG. 9, may alternatively be included.

Other configurations are substantially the same as those described in the above-described semiconductor package 100A and the like, and a detailed description thereof will be omitted.

Figure 14:
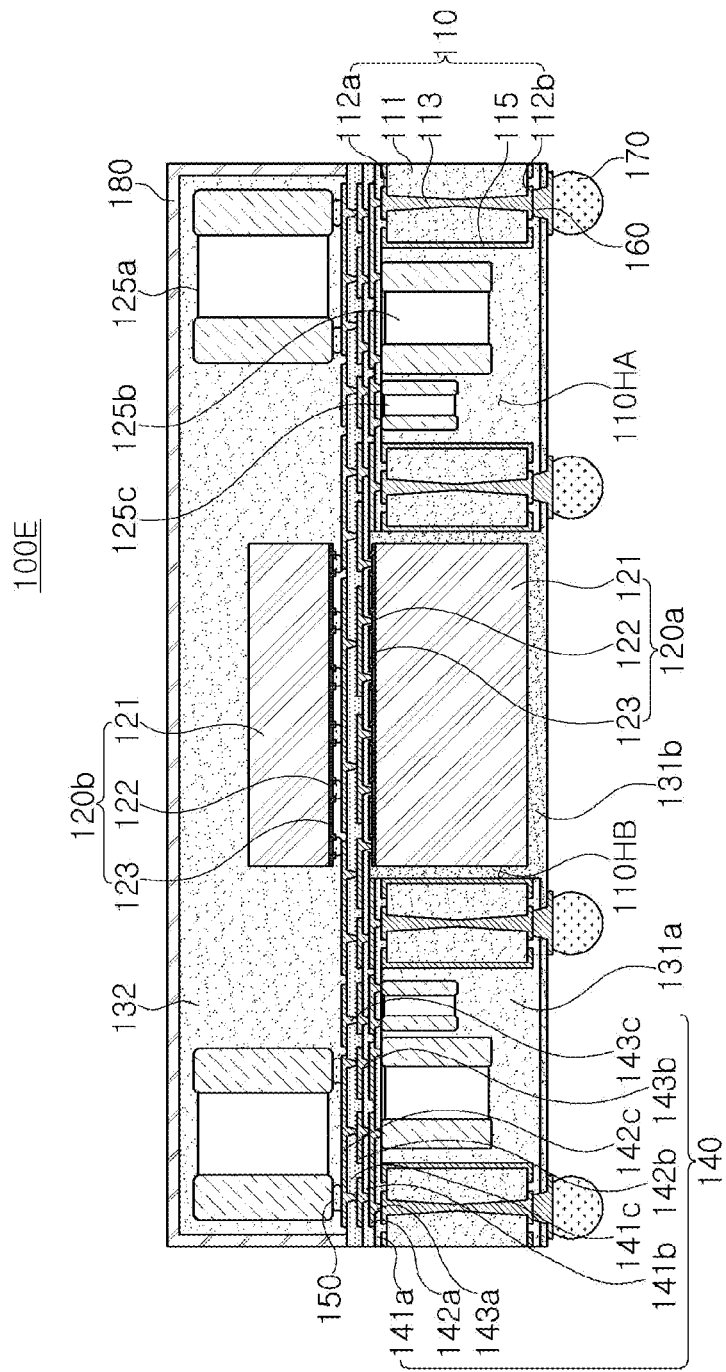
FIG. 14 is a schematic cross-sectional view illustrating another example of a semiconductor package in accordance with the principles of the disclosure.

FIG. 14 is a schematic cross-sectional view illustrating another example of a semiconductor package.

Referring to FIG. 14, a semiconductor package 100E according to another embodiment may further include a second semiconductor chip 120b mounted on the connection structure 140 together with the passive component 125a, in addition to the first semiconductor chip 120a in the frame 110, an upper encapsulant 132 covering the second semiconductor chip 120b and the passive component 125a, and a metal layer 180, in a manner different from the semiconductor package 100D of FIG. 13. In other words, in the semiconductor package 100E, a plurality of semiconductor chips 120a and 120b may be disposed above and below the connection structure 140. The second semiconductor chip 120b above the connection structure may be mounted to allow an active surface to face an upper surface of the connection structure 140. The second semiconductor chip 120b above the connection structure may be mounted on the connection structure 140 by a bump 150, and may be electrically connected to a third redistribution layer 142c of the connection structure 140. Thus, the plurality of semiconductor chips 120a and 120b may be mounted above and below the connection structure 140, respectively, to allow their respective active surfaces to face opposite surfaces of the connection structure 140. According to an embodiment, an upper encapsulant 132 and a metal layer 180 may be omitted. Other configurations are substantially the same as those described in the above-described semiconductor packages 100A and 100D, and the like, and a detailed description thereof will be omitted.

Figure 15:
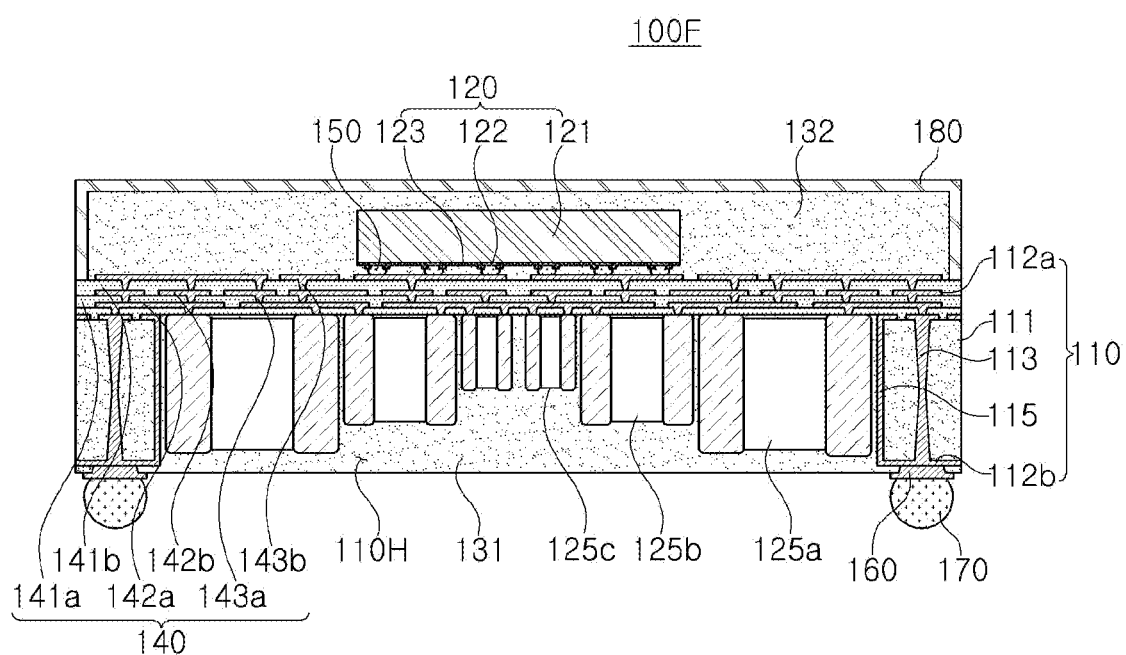
FIG. 15 is a schematic cross-sectional view illustrating another example of a semiconductor package in accordance with the principles of the disclosure.

FIG. 15 is a schematic cross-sectional view illustrating another example of a semiconductor package.

Referring to FIG. 15, in a semiconductor package 100F according to another embodiment, in a manner different from the semiconductor package 100A of FIG. 9, the passive components 125a, 125b, and 125c are disposed in the through-hole 110H of the frame 110, and a semiconductor chip 120 is mounted on the connection structure 140 through the bump 150. Thus, the first encapsulant 131 covers the passive components 125a, 125b, and 125c, and the second encapsulant 132 covers the semiconductor chip 120. In the semiconductor package 100F, a size of a package may be reduced by a width, in which the semiconductor chip 120 and the passive components 125a, 125b, and 125c are overlapped along the plane in which the connection structure extends. A thickness of the semiconductor chip 120 may be less than a thickness of at least one among the passive components 125a, 125b, and 125c. In detail, a thickness of the semiconductor chip 120 may be less than a thickness of the thinnest passive component 125c, among the passive components 125a, 125b, and 125c, but an embodiment is not limited thereto. In this case, a thickness of an upper region of the semiconductor package 100F disposed above the connection structure 140, including the semiconductor chip 120, is significantly reduced, and the passive components 125a, 125b, and 125c, which are relatively thick, are sealed in a lower portion of the semiconductor package 100F disposed below the connection structure 140, so a thickness of the semiconductor package 100F may be optimized. Alternatively, in an embodiment, a thickness of the semiconductor chip 120 may be greater than a thickness of the thickest passive component 125a, among the passive components 125a, 125b, and 125c. In this case, a thickness of a lower region of the semiconductor package 100F disposed below the connection structure 140, including the passive components 125a, 125b, and 125c, is significantly reduced, so a thickness of the semiconductor package 100F may be optimized. Other configurations are substantially the same as those described in the above-described semiconductor package 100A and the like, and a detailed description thereof will be omitted.

Figure 16:
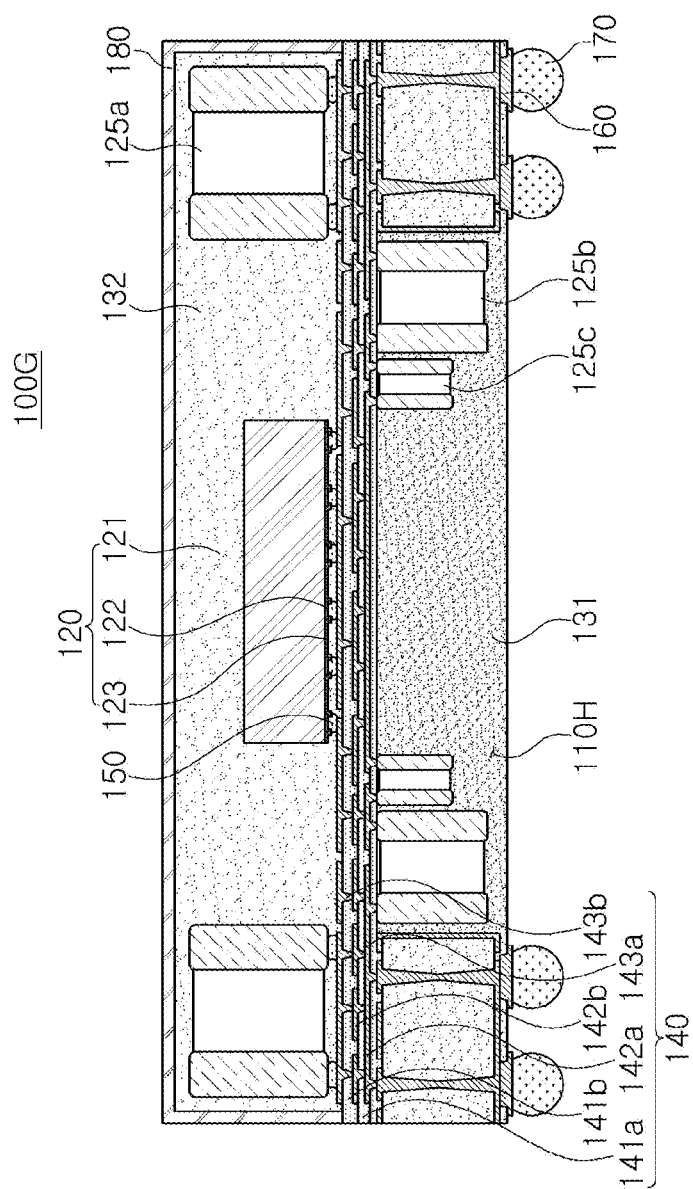
FIG. 16 is a schematic cross-sectional view illustrating another example of a semiconductor package in accordance with the principles of the disclosure.

FIG. 16 is a schematic cross-sectional view illustrating another example of a semiconductor package.

Referring to FIG. 16, in a semiconductor package 100G according to another embodiment, in a manner different from the semiconductor package 100F of FIG. 15, a portion of the passive components 125a, 125b, and 125c (e.g., passive components 125b and 125c) are disposed in the through-hole 110H of the frame 110, and the semiconductor chip 120 and a remaining portion of the passive components 125a, 125b, and 125c (e.g., passive component 125a) are mounted on the connection structure 140 through the bumps 150. In the semiconductor package 100G according to an embodiment, the semiconductor chip 120 is illustrated not to overlap the passive components 125b and 125c therebelow on the plane (e.g., the semiconductor chip 120 is horizontally offset from the passive components 125b and 125c in a horizontal direction aligned with the first and second surfaces of the connection structure 140), but an embodiment is not limited thereto. Alternatively, at least a portion of the semiconductor chip 120 may be disposed to overlap the passive components 125b and 125c (e.g., along a stacking direction of the semiconductor chip 120 on the connection structure 140). Other configurations are substantially the same as those described in the above-described semiconductor package 100A and 100F, and the like, and a detailed description thereof will be omitted.

Figure 17:
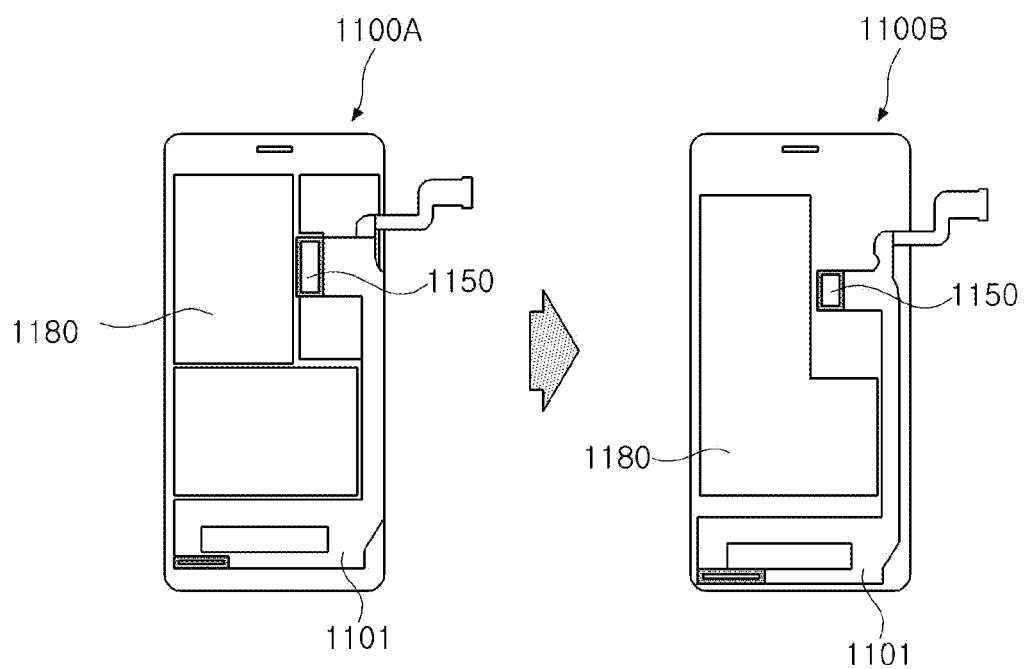
FIG. 17 is a schematic plan view illustrating an effect of applying the semiconductor package according to the disclosure in a case of an electronic device.

FIG. 17 is a schematic plan view illustrating an effect of applying the semiconductor package according to the disclosure to an electronic device.

Referring to FIG. 17, recently, as a size of display for mobile devices 1100A and 1100B increases, the need of increasing battery capacity is increasing. Here, due to an increase in the battery capacity, an area occupied by the battery 1180 in device 1100B is increased. To this end, a reduction in a size of the printed circuit board 1101 such as a mainboard is provided. Thus, due to a reduction in a mounting area of a component, an area occupied by a module 1150 including a power management integrated circuit (PMIC) and passive components is gradually decreased. In this case, when the semiconductor packages 100A, 100B, 100C, 100D, 100E, 100F, and/or 100G according to an embodiment is applied to the module 1150, a size is able to be reduced. Thus, the area, which becomes smaller as described above may be effectively used.

As set forth above, according to an embodiment in the present disclosure, a semiconductor package having a significantly reduced size and improved reliability may be provided.

While exemplary embodiments have been shown and described above, it will be apparent to those skilled in the art that modifications and variations could be made without departing from the scope of the present invention as defined by the appended claims.

What is claimed is:

1. A semiconductor package, comprising:
a frame having a through-hole;
a first semiconductor chip disposed in the through-hole of the frame, and having an active surface on which a connection pad is disposed, an inactive surface opposing the active surface, and a side surface connecting the active and inactive surfaces;
a first encapsulant covering at least a portion of each of the inactive surface and the side surface of the first semiconductor chip;
a connection structure having a first surface having disposed thereon the active surface of the first semiconductor chip and a first surface of the frame, and including an insulating layer, a redistribution layer disposed on the insulating layer, and at least one via extending from the redistribution layer through the insulating layer to directly contact and electrically connect to the connection pad of the first semiconductor chip;
a first passive component disposed on a second surface of the connection structure opposing the first surface of the connection structure, the first passive component being electrically connected to the redistribution layer;
a second passive component disposed on the first surface of the connection structure and electrically connected to the redistribution layer; and
a plurality of metal pads protruding from a second surface of the frame opposing the first surface of the frame, each metal pad having a respective electrical connection metal thereon,
wherein the connection structure has a first thickness, measured between the first and second surfaces thereof, in a first region having the first semiconductor chip thereon, and a second thickness, measured between the first and second surfaces thereof, different from the first thickness, in a second region having the second passive component thereon, the second passive component including at least one of a Multilayer Ceramic Capacitor (MLCC), a capacitor, an inductor, or a bead,
wherein the frame has an additional through-hole spaced apart from the through-hole in which the first semiconductor chip is disposed,
the second passive component is disposed in the additional through-hole of the frame, the second passive component having a thickness smaller than a thickness of the first semiconductor chip, and
the connection structure has the first thickness throughout a region facing the through-hole of the frame, and has the second thickness higher than the first thickness throughout a region facing the additional through-hole of the frame.

2. The semiconductor package of claim 1, wherein at least a portion of the first passive component is disposed in a region immediately above the frame in a stacking direction of the first passive component on the connection structure.

3. The semiconductor package of claim 2, further comprising:
a third passive component disposed on the second surface of the connection structure.

4. The semiconductor package of claim 3, wherein the third passive component has a thickness thinner than a thickness of the first passive component, and the first and second surfaces of the frame oppose each other in a stacking direction, and the first encapsulant extends only over the second surface of the frame, from among the first and second surfaces of the frame, in the stacking direction.

5. The semiconductor package of claim 1, further comprising:
an electrical connection metal disposed on a lower surface of the frame,
wherein the connection structure includes at least one additional insulating layer and at least one additional redistribution layer in the second region having the second passive component thereon than in the first region having the first semiconductor chip thereon.

6. The semiconductor package of claim 1, wherein the first passive component has first and second opposing surfaces, and a side surface connecting the first and second opposing surfaces, and the first surface of the first passive component faces the second surface of the connection structure, and
the semiconductor package further comprises a second encapsulant covering at least a portion of each of the second surface of the first passive component and the side surface of the first passive component.

7. The semiconductor package of claim 6, wherein a first surface of the second encapsulant faces the second surface of the connection structure, and
the semiconductor package further comprises a metal layer disposed on a second surface of the second encapsulant opposing the first surface of the second encapsulant, and on a side surface of the second encapsulant connecting the first and second surfaces of the second encapsulant.

8. The semiconductor package claim 6, wherein the second encapsulant includes a material different from a material of the first encapsulant.

9. The semiconductor package of claim 1, further comprising:
a second semiconductor chip disposed adjacently to the first passive component on the second surface of the connection structure.

10. The semiconductor package of claim 9, wherein the second semiconductor chip has an active surface on which an additional connection pad is disposed, and
the active surface of the second semiconductor chip is disposed to face the second surface of the connection structure.

11. A semiconductor package, comprising:
a frame having a through-hole;
a first electronic component disposed in the through-hole of the frame;
a first encapsulant covering at least a portion of the first electronic component;
a connection structure having a first surface having disposed thereon the first electronic component and a first surface of the frame, and including an insulating layer, a redistribution layer disposed on the insulating layer, and at least one via extending from the redistribution layer through the insulating layer to directly contact and electrically connect to a terminal of the first electronic component;
a plurality of second electronic components disposed on a second surface of the connection structure opposing the first surface in a stacking direction, each second electronic component being electrically connected to the redistribution layer; and a plurality of metal pads protruding from a second surface of the frame opposing the first surface of the frame, each metal pad having a respective electrical connection metal thereon,
wherein the plurality of second electronic components are disposed outside of a region of overlap, in the stacking direction, with the first electronic component, and
wherein the region of overlap with the first electronic component on the second surface of the connection structure is free of electronic components thereon.

12. The semiconductor package of claim 11, wherein the first electronic component includes a passive component, and the plurality of second electronic components includes a semiconductor chip, and
the first and second surfaces of the frame oppose each other in the stacking direction, and the first encapsulant extends only over the second surface of the frame, from among the first and second surfaces of the frame, in the stacking direction.

13. The semiconductor package of claim 11, wherein the plurality of second electronic components further includes:
a passive component disposed on an opposite side, along a lateral direction orthogonal to the stacking direction, of the region of overlap with the first electronic component relative to the semiconductor chip, on the second surface of the connection structure, and that is electrically connected to the connection structure, such that the region of overlap with the first electronic component on the second surface of the connection structure is free of electronic components thereon.

14. A semiconductor package comprising:
a connection structure having first and second surfaces opposing each other in a stacking direction, and including pluralities of insulating layers, redistribution layers, and vias for providing electrical interconnections between the redistribution layers;
a frame disposed on the first surface of the connection structure, and having a frame insulating layer with a through-hole;
a semiconductor chip disposed on the first surface of the connection structure and in the through-hole of the frame to be spaced apart from the frame insulating layer, and having an active surface, on which is disposed a connection pad directly contacting a via of the connection structure, facing the first surface of the connection structure;
at least one electronic component disposed on the second surface of the connection structure to overlap with the semiconductor chip along a stacking direction of the semiconductor chip on the connection structure;
an encapsulant disposed in the through-hole between the frame insulating layer and the semiconductor chip, and extending to a first surface of the frame opposing a second surface of the frame facing the connection structure;
a plurality of metal pads protruding from the first surface of the frame, each metal pad having a respective electrical connection metal thereon;
a second encapsulant disposed on the second surface of the connection structure and on the at least one electronic component to embed the at least one electronic component; and
a metal layer extending from the second surface of the connection structure and over the second encapsulant,
wherein the connection structure includes at least one additional insulating layer and at least one additional redistribution layer, and an entire portion of each of the at least one additional insulating layer and the at least one additional redistribution layer is disposed outside of a region of overlap, in the stacking direction, with the through-hole having the semiconductor chip therein, relative to within the region of overlap with the through-hole having the semiconductor chip therein.

15. The semiconductor package of claim 14, wherein the encapsulant extending to the first surface of the frame has a plurality of openings that expose a wiring layer of the frame, each opening having a respective metal pad of the plurality of metal pads thereon and the respective electrical connection metal for connection to a circuit board, and the first and second surfaces of the frame oppose each other in a stacking direction, and the encapsulant extends only over the first surface of the frame, from among the first and second surfaces of the frame, in the stacking direction.

16. The semiconductor package of claim 14, wherein the frame further comprises a frame metal layer covering side surfaces of the through-hole of the frame insulating layer.

17. The semiconductor package of claim 1, wherein the first thickness of the connection structure in the first region having the first semiconductor chip thereon is smaller than the second thickness of the connection structure in the second region having the second passive component thereon.

\* \* \* \* \*